(12) United States Patent
Bronzati et al.

(10) Patent No.: US 12,727,110 B2
(45) Date of Patent: Sep. 1, 2026

(54) RAIL MOUNTED POWER SYSTEM FOR POWER SUPPLY FREE CHASSIS

(71) Applicant: Dell Products L.P., Round Rock, TX (US)

(72) Inventors: Fabricio Almeida Bronzati, São Paulo (BR); Dharmesh M. Patel, Round Rock, TX (US)

(73) Assignee: Dell Products L.P., Round Rock, TX (US)

(*) Notice: Subject to any disclaimer, the term of this patent is extended or adjusted under 35 U.S.C. 154(b) by 224 days.

(21) Appl. No.: 18/619,721

(22) Filed: Mar. 28, 2024

(65) Prior Publication Data

US 2025/0311139 A1 Oct. 2, 2025

(51) Int. Cl.
*H05K 7/14* (2006.01)

(52) U.S. Cl.
CPC .................................. *H05K 7/1492* (2013.01)

(58) Field of Classification Search
CPC .................................................... H05K 7/1492
USPC .......................................................... 307/147
See application file for complete search history.

(56) References Cited

U.S. PATENT DOCUMENTS 7,400,062 B2 7/2008 Pincu
7,493,503 B2 2/2009 Aldereguia
8,583,945 B2 11/2013 Tran
8,984,508 B2 3/2015 Shu et al.
9,052,904 B1 6/2015 Cooley
9,141,164 B2 9/2015 Bailey et al.
9,642,282 B2 5/2017 Bailey et al.
9,727,100 B1 8/2017 Eaton
9,800,052 B2 10/2017 Li et al.
10,521,001 B2 12/2019 Wilcox et al.
11,234,340 B2 * 1/2022 Bailey ................. H05K 7/1492
11,567,810 B1 1/2023 Kenney
2003/0065958 A1 4/2003 Hansen
2004/0158771 A1 * 8/2004 Garnett ............... G06F 11/2015 714/E11.017
2006/0203433 A1 9/2006 Peterson
2009/0132842 A1 5/2009 Brey
2011/0304966 A1 12/2011 Schrempp
2012/0054512 A1 3/2012 Archibald
2012/0096297 A1 4/2012 Archibald
2012/0324259 A1 12/2012 Aasheim
(Continued)

*Primary Examiner* — Alfonso Perez Borroto
(74) *Attorney, Agent, or Firm* — WOMBLE BOND DICKINSON (US) LLP

(57) ABSTRACT

Methods, systems, and devices for providing computer implemented services are disclosed. To provide the computer implemented services, a rack system may be used. The rack system may include a power supply free chassis for housing components that provide the computer implemented services. The rack system may further include a rail mounted power system for mounting directly to a single vertical rail of the rack system. The rail mounted power system may include at least two power supply units for obtaining power supply level power from a power distribution unit (PDU), the PDU adapted to obtain rack system level power and provide the power supply level power to the at least two power supply units. Using the power supply level power, the at least two power supply units may provide logic level power to the hardware components, thereby causing the components to operate.

20 Claims, 8 Drawing Sheets

(56) References Cited

U.S. PATENT DOCUMENTS

2014/0063752 A1 3/2014 Sisler
2014/0118886 A1 5/2014 Ehlen
2014/0164814 A1 6/2014 Henise, IV
2015/0177813 A1 6/2015 Bailey
2016/0162004 A1 6/2016 Ljubuncic
2016/0359683 A1 12/2016 Bartfai-Walcott
2017/0075406 A1 3/2017 Mineo
2017/0214432 A1 7/2017 Cafe
2017/0269646 A1 9/2017 Zhai
2017/0308137 A1 10/2017 Oliveira
2019/0041971 A1 2/2019 Ananthakrishnan
2019/0050036 A1 2/2019 Hall
2019/0296470 A1 9/2019 Wig
2020/0059088 A1* 2/2020 Ferguson ................. H02H 3/06
2020/0127921 A1 4/2020 Zhu
2020/0315054 A1* 10/2020 Shen ..................... G06F 1/3296
2021/0132674 A1 5/2021 Jenne
2022/0221916 A1 7/2022 Eiland
2023/0045176 A1* 2/2023 Chapel ................. H01R 25/006
2023/0066580 A1 3/2023 Katiyar
2023/0098147 A1 3/2023 Gao
2024/0320121 A1 9/2024 Chaudhari
2025/0111156 A1 4/2025 Teymoori
2025/0199855 A1 6/2025 Okamura
2025/0209304 A1 6/2025 Dekel
2025/0306650 A1 10/2025 Bronzati
2025/0307030 A1 10/2025 Bronzati

* cited by examiner

RAIL MOUNTED POWER SYSTEM FOR POWER SUPPLY FREE CHASSIS

FIELD

Embodiments disclosed herein relate generally to device management. More particularly, embodiments disclosed herein relate to systems and methods for hardware resource management of devices in data processing systems.

BACKGROUND

Computing devices may provide computer-implemented services. The computer-implemented services may be used by users of the computing devices and/or devices operably connected to the computing devices. The computer-implemented services may be performed with hardware components such as processors, memory modules, storage devices, and communication devices. The operation of these components may impact the performance of the computer-implemented services.

BRIEF DESCRIPTION OF THE DRAWINGS

Embodiments disclosed herein are illustrated by way of example and not limitation in the figures of the accompanying drawings in which like references indicate similar elements.

DETAILED DESCRIPTION

Figure 1:
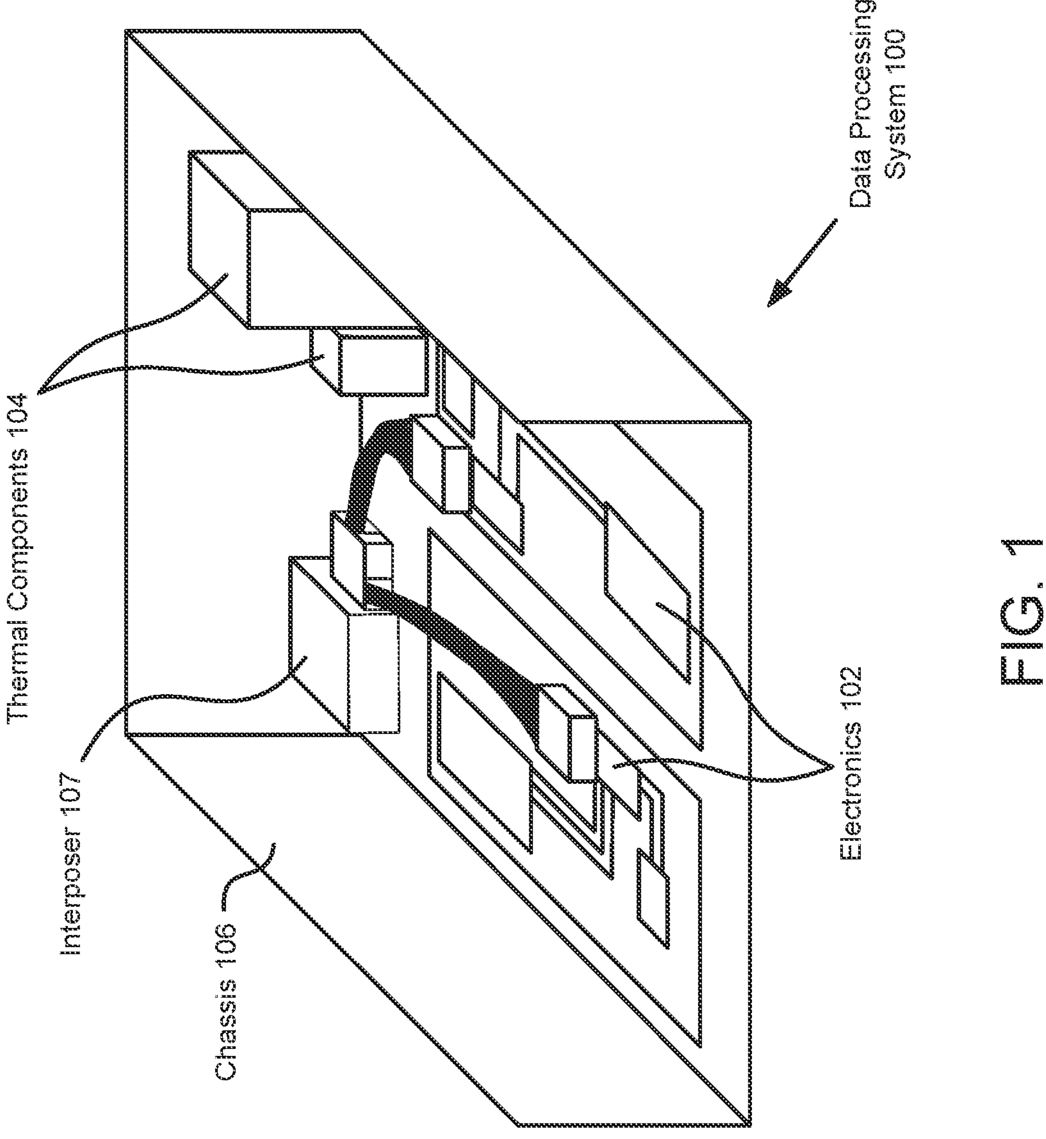
FIG. 1 shows a block diagram illustrating a data processing system in accordance with an embodiment.

Various embodiments will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments disclosed herein.

Reference in the specification to "one embodiment" or "an embodiment" means that a particular feature, structure, or characteristic described in conjunction with the embodiment can be included in at least one embodiment. The appearances of the phrases "in one embodiment" and "an embodiment" in various places in the specification do not necessarily all refer to the same embodiment.

References to an "operable connection" or "operably connected" means that a particular device is able to communicate with one or more other devices. The devices themselves may be directly connected to one another or may be indirectly connected to one another through any number of intermediary devices, such as in a network topology.

In general, embodiments disclosed herein relate to methods and systems for providing, at least in part, computer implemented services. To provide the services, a data processing system may include any number of hardware components (e.g., storage devices, memory modules, processors, etc.). To facilitate placement and management of the hardware components, the hardware components may be positioned in a chassis. For example, to provide its functionality, the chassis may be implemented with a form factor compliant (e.g., a 1/2U sled) enclosure usable to integrate the data processing system into a high-density computing environment, such as a rack mount chassis management system (herein referred to as a "rack system").

This chassis may facilitate the placement and the management of the hardware components in a computing environment by providing limited available space within the interior of the chassis. This limited available space may provide open and operable connections through which a specific quantity and/or type of the hardware components may be connected (e.g., be installed onto the data processing system).

However, a specific quantity and/or type of the hardware components capable of being positioned within the interior may be limited by the limited available space within the interior. Consequently, by limiting the quantity and/or the type of the hardware components, a quality, quantity, and/or type of the various functionalities on which the computer implemented services depend may also be limited. Thus, a quality, quantity, and/or type of the computer implemented services may be limited by the limited available space within the interior of the enclosure.

To increase the type, the quantity, and/or the quality of computer implemented services provided by the data processing system, additional space within the interior of the chassis may be made available, thereby increasing the type and/or quantity of hardware components capable of being positioned within the interior of the chassis.

To provide the additional available space, power components of the data processing system may be positioned outside of the chassis (e.g., an exterior of the chassis) rather than within the interior (resulting in the chassis becoming a "power supply free chassis").

By doing so, a portion of the interior (e.g., a portion of the volume that makes up the interior) in which the power components may have been positioned may now facilitate placement of additional hardware resources.

To position the power components outside of the power supply free chassis, a rail mounted power system may be integrated with a rack system housing the data processing system. This rail mounted power system may be used to not only provide power to the hardware components, but also provide power management to decrease a likelihood of compromise of the data processing system.

In an embodiment, a method for powering hardware components positioned in a power supply free chassis of a rack system is provided.

The method may include: obtaining, by a rail mounted power system of the rack system that is positioned outside of the power supply free chassis and on a single vertical rail of the rack system, rack system level power, the rack system level power being unusable to natively power the hardware components; and providing, by the rail mounted power system of the rack system and using the rack system level power, logic level power to the hardware components, the logic level power being usable to natively power the hardware components.

Providing the logic level power may include: distributing, by a power distribution unit of the rail mounted power system, portions of the rack system level power to at least two power supply units; converting, by the at least two power supply units, the portions of the rack system level power to the logic level power; directing, by at least one of the at least two power supply units, the logical level power into a logic level power line that connects the at least one of the at least two power supply units and at least one hardware component of the hardware components.

The method may further include: detecting, by a sensor of the rail mounted power system, a position of the power supply free chassis; comparing, by the rail mounted power system, the position of the power supply free chassis to an acceptable position; and in an instance of the comparing where the position of the power supply free chassis is not in the acceptable position: limiting, by the rail mounted power system, the directing of the logical level power into the logical level power line to depower the power supply free chassis.

In an embodiment, a rack system is provided. This rack system may be a same rack system as the rack system discussed above.

The rack system may include: a power supply free chassis adapted to house hardware components that provide computer implemented services; and a rail mounted power system adapted for mounting directly to a single vertical rail of an enclosure system, wherein the rail mounted power system may include: at least two power supply units adapted to: obtain power supply level power from a power distribution unit, and provide logic level power to the hardware components using the power supply level power; and the power distribution unit adapted to: obtain rack system level power, and provide the power supply level power to the at least two power supply units.

Providing the logic level power may include: converting the power supply level power to the logic level power; and directing the logic level power to a logic level power line that connects at least one of the at least two power supply units to at least one hardware component of the hardware components.

The at least one hardware component may be connected to the at least one of the at least two power supply units via an interposer positioned in the power supply free chassis.

The rack system may also include: the interposer adapted to: obtain the logic level power; divide the logic level power into a plurality of portions; and distribute the plurality of portions to the hardware components.

The logic level power may be usable to power the hardware components without modification.

The rack system may also include: a second power supply free chassis adapted to house second hardware components that provide second computer implemented services, wherein the at least two power supply units are further adapted to: provide logic level power to the second hardware components using the power supply level power.

The power supply free chassis and the second power supply free chassis may be vertically stacked in the rack system using the single vertical rail.

The power supply free chassis and the second power supply free chassis may be positioned in two separate vertical stacks of power supply free chassis, the power supply free chassis and the second power supply free chassis are separated by the single vertical rail, and the rail mounted power system may be positioned between the power supply free chassis and the second power supply free chassis.

The rack system may further include: a second rail mounted power system adapted for mounting directly to a second single vertical rail of the enclosure system.

The power supply free chassis may be adapted to be redundantly powered by the rail mounted power system and the second rail mounted power system.

The single vertical rail and the second vertical rail may be positioned on opposite sides of the power supply free chassis.

the rail mounted power system further comprises:

A sensor adapted to identify whether the power supply free chassis may be positioned in a first position.

The at least two power supplies may be further adapted to limit distribution of the logic level power while the power supply free chassis if not in the first position.

In an embodiment, a non-transitory media is provided. The non-transitory media may include instructions that when executed by a processor cause, at least in part, the computer-implemented method to be performed.

In an embodiment, a data processing system is provided. The data processing system may include the non-transitory media and a processor and may, at least in part, perform the method when the computer instructions are executed by the processor.

Turning to FIG. 1, a diagram illustrating a data processing system in accordance with an embodiment is shown. The data processing system shown in FIG. 1 may provide computer implemented services. The computer implemented services may include any type and/or quantity of computer implemented services. For example, the computer implemented services may include data storage services, instant messaging services, database services, and/or any other type of service that may be implemented with a computing device.

To provide the computer implemented services, the data processing system may include various hardware components. These hardware components may facilitate various functionalities of a data processing system (e.g., 100). For example, to provide the computer implemented services, data processing system 100 may include electronics 102, power components (not explicitly shown in FIG. 1), thermal components 104, and chassis 106. Each of these is discussed below.

Electronics 102 may include various types of hardware components such as processors, memory modules, storage devices, communications devices, and/or other types of devices. Any of these hardware components may be operably connected to one another using circuit card traces, cabling, connectors, etc. that establish electrical connections used to transmit information between the hardware components.

Power components (not explicitly shown) may power any of the hardware components of data processing system 100. For example, power components may include power supplies, power cables, and/or other types of devices usable to power the hardware components.

Thermal components 104 may thermally manage any of the hardware components of data processing system 100. For example, thermal components 104 may include fans, heat sinks, and/or other types of devices usable to thermally manage the hardware components.

Any of the hardware components of data processing system 100 may be positioned within an interior of chassis 106. For example, chassis 106 may include an enclosure in which physical structures of electronics 102 (e.g., processors, memory, etc.), the power components (e.g., power supply units, not explicitly shown), Interposer 107, and/or thermal components 104 (e.g., fans, heat sinks, etc.) may be positioned.

For example, to provide its functionality, chassis 106 may be implemented with a form factor compliant (e.g., a 1/2U sled) enclosure usable to integrate data processing system 100 into a high-density computing environment, such as a rack mount chassis management system (herein referred to as the "rack system").

Therefore, chassis 106 may facilitate placement and management of electronics 102 and/or other components in a computing environment by providing limited available space within the interior of the enclosure.

This limited available space may provide open and operable connections through which a specific quantity and/or type of the hardware components may be connected (e.g., be installed onto data processing system 100). For example, once installed, the hardware components may facilitate various functionalities of data processing system 100, thereby causing computer implemented services to be provided based on the various functionalities being facilitated.

However, by having the limited available space within the interior, the quantity and/or type of hardware component capable of being positioned within the interior (e.g., installed into data processing system 100) may also be limited. Consequently, by limiting the quantity and/or the type of the hardware components, a quality, quantity, and/or type of the various functionalities on which the computer implemented services depend may also be limited. Thus, a quality, quantity, and/or type of the computer implemented services may be limited by the limited available space within the interior of the enclosure.

In general, embodiments disclosed herein relate to systems, devices, and methods for increasing the type, quantity, and/or quality of computer implemented services provided by a data processing system. To do so, additional space within the interior of the enclosure may be made available, thereby increasing the type and/or quantity of hardware components capable of being positioned within the interior of the enclosure.

To provide the additional available space, for example, the power components (previously mentioned) may be positioned outside of the enclosure (e.g., an exterior of the enclosure) rather than within the interior. By doing so, a portion of the interior (e.g., a portion of the volume that makes up the interior) in which the power components may have been positioned may now facilitate placement of additional hardware resources.

For example, the power supply units may be positioned (e.g., mounted) with rails of a rack system outside of the enclosure (discussed further below), and thus, a power supply free chassis (e.g., 106) may facilitate the placement of the additional hardware resources. This power supply free chassis may provide a same functionality as described above, however the power supply free chassis may (i) not include power supplies within its interior and may (ii) be positioned with a rack system integrated with a rail mounted power system.

To power the hardware components and/or the additional hardware resources housed within the power supply free chassis, and thereby cause the computer implemented services to be provided, the rail mounted power system may be used.

By using the rail mounted power system, power may be provided and managed for hardware components of the data processing system. For example, the rail mounted power system may (i) provide power that is natively usable by the hardware components to the hardware components, and (ii) manage the power (e.g., limit the power) based on safety processes in place to decrease a likelihood of compromise caused by an interruption of power transmissions for the hardware components and/or additional hardware resources.

To provide power that is natively usable by the hardware components and/or the additional hardware resources, the power supply free chassis and/or the rail mounter power system may include one or more interposers (e.g., interposer 107, shown in FIG. 1).

For example, interposer 107 may route power provided by the power components to electronics 102. To do so, interposer 107 may include an electrical interface that receives power at a first connection (e.g., via some power cables and/or connection pins) and spreads at least a portion of that power to any number of different connections (e.g., leading to the various hardware components of electronics 102).

Figure 2A:
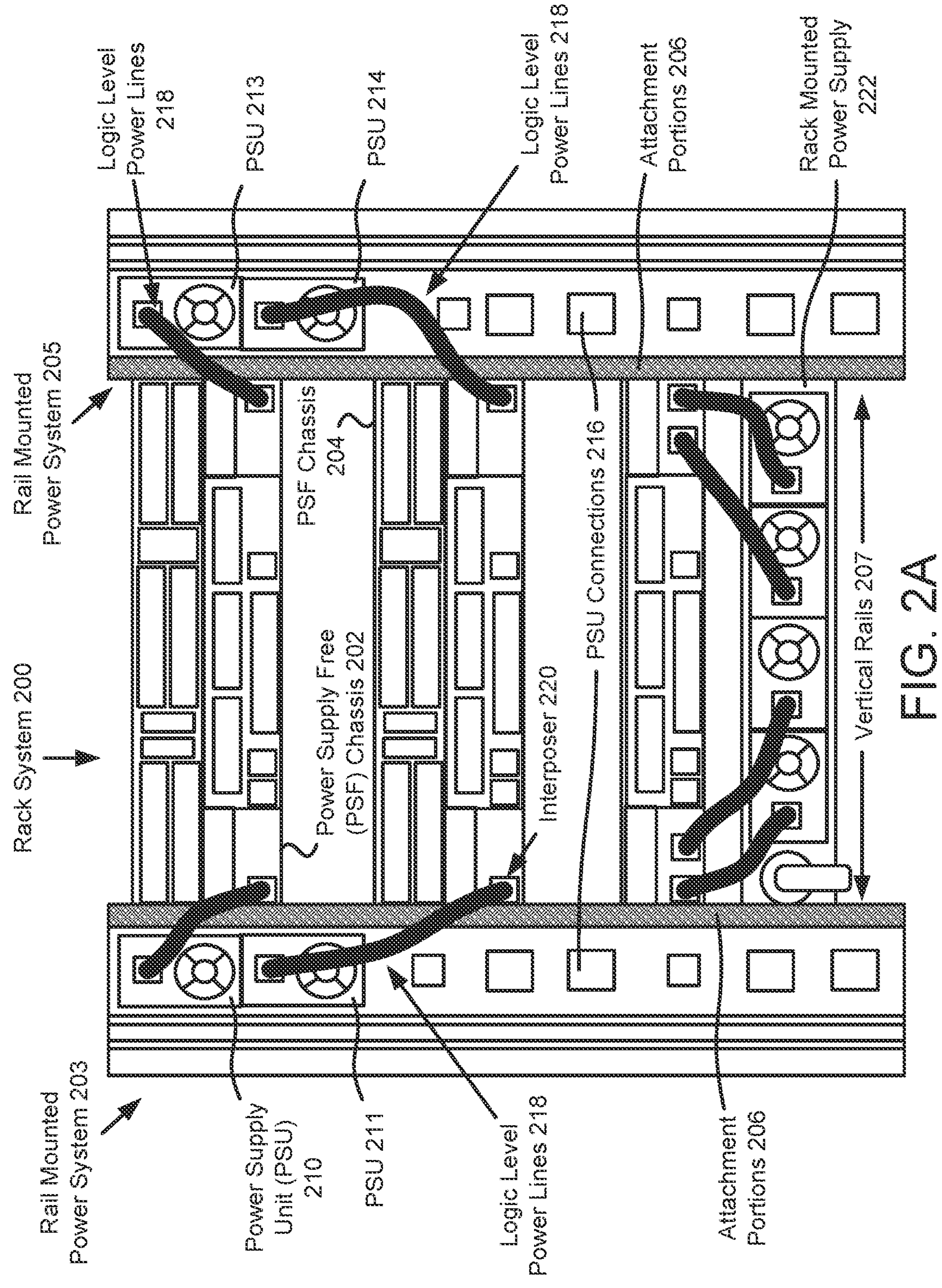
FIGS. 2A-2C show a diagram illustrating a rack system in accordance with an embodiment.
Figure 2B:
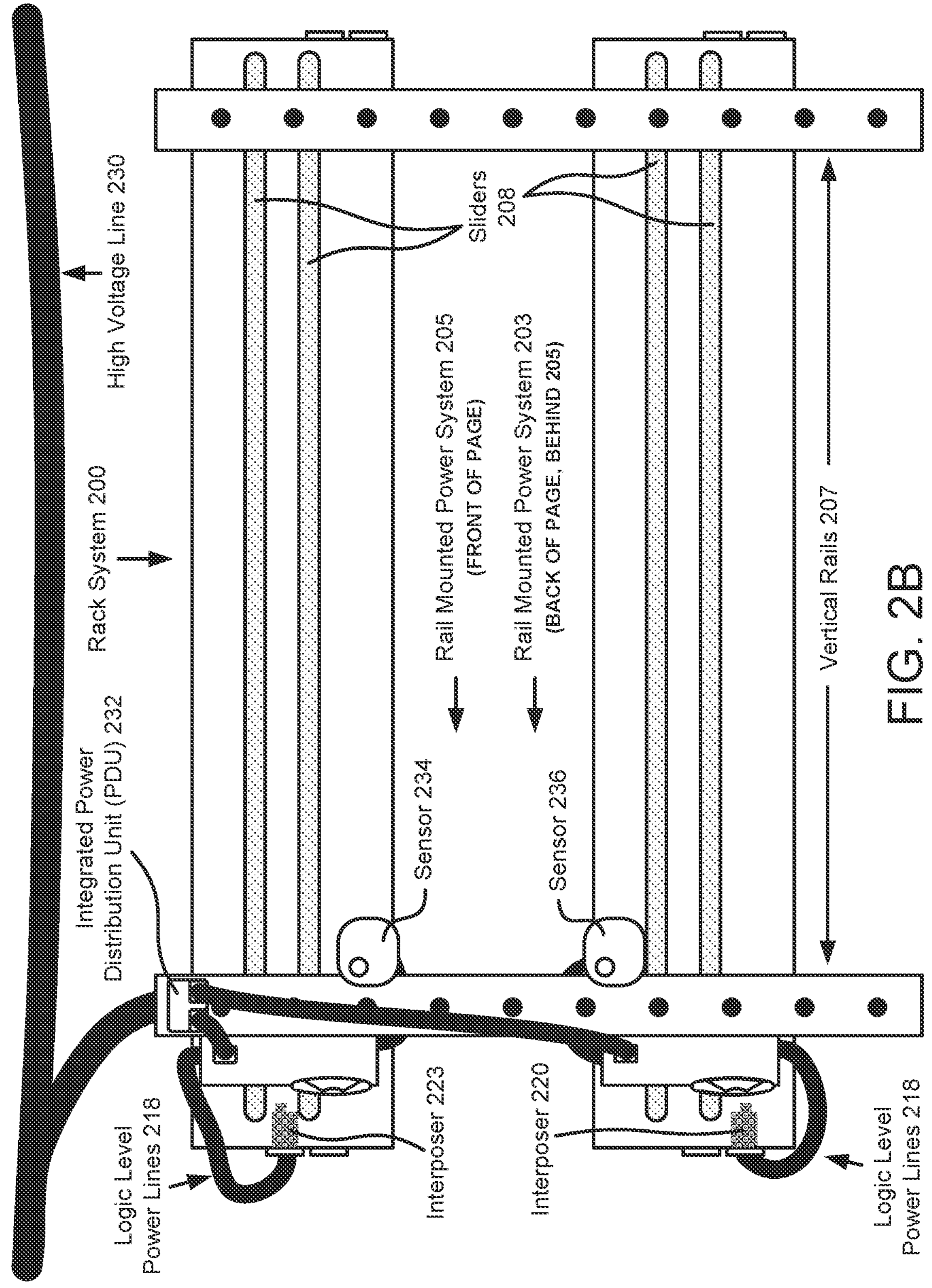
Figure 2C:
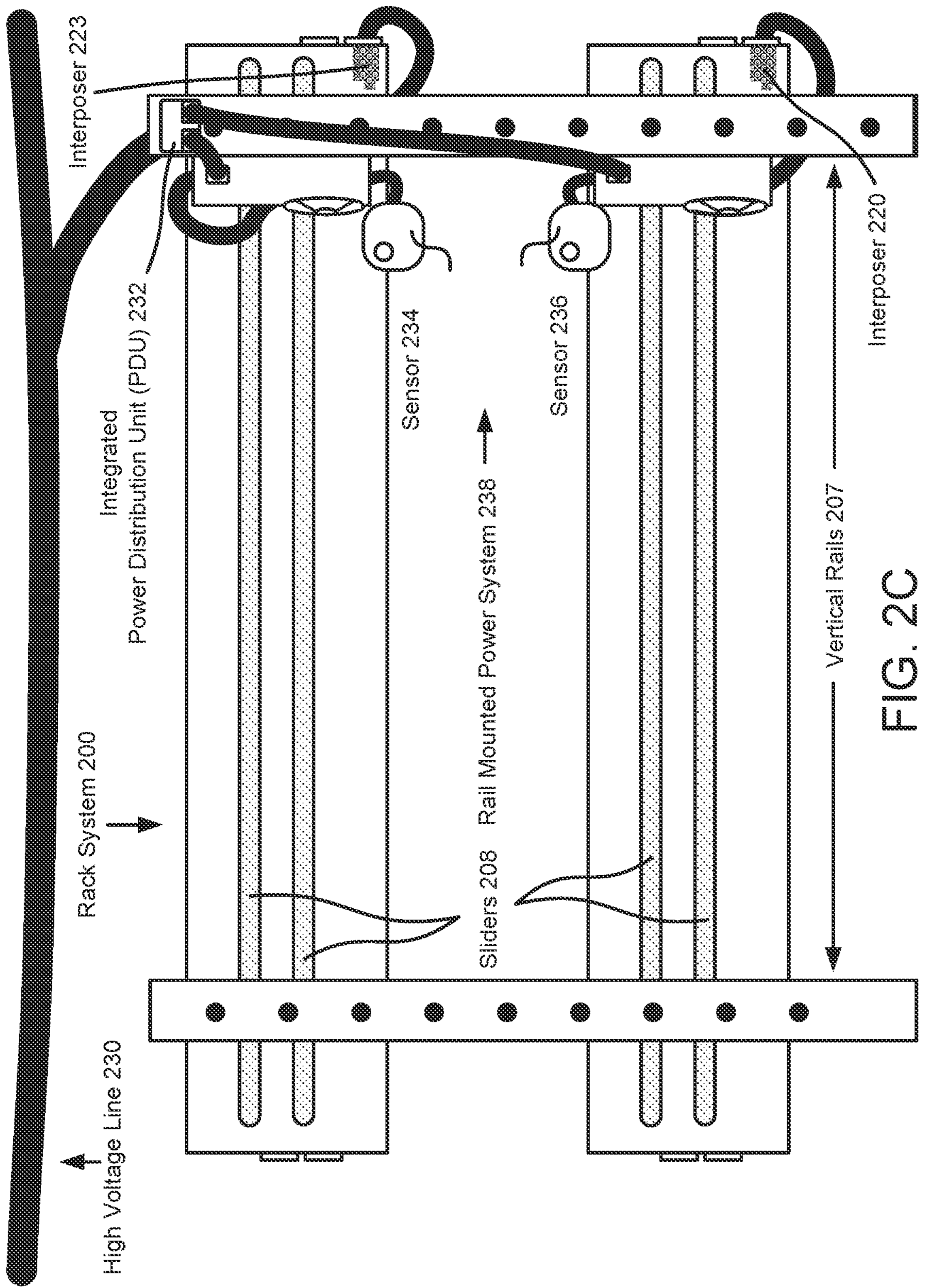

To manage the power (e.g., limit the power) to decrease a likelihood of compromise caused by an interruption of power transmissions, the rail mounted power system may include sensors (e.g., 234 and/or 236, shown in FIGS. 2B-2C). These sensors may be used to identify whether the power supply free chassis is positioned in an acceptable position. For example, the power components may be adapted to limit distribution of power while the power supply free chassis is not in the acceptable position.

Refer to FIGS. 2A-2C below for additional detail regarding the rail mounted power system, rack system, and/or the power supply free chassis.

Thus, by the rail mounted power system to supply data processing system 100 with power from an exterior of the chassis, the type, quantity and/or quality of computer implemented services may be increased.

While illustrated in FIG. 1 with a limited number of specific components, a data processing system may include additional, fewer, and/or different components without departing from embodiments disclosed herein.

As previously noted, a power supply free chassis may (i) not include power supplies within its interior and may (ii) be positioned with a rack system integrated with a rail mounted power system.

FIGS. 2A-2C show diagrams illustrating examples of power supply free chassis positioned with a rack system that includes a rail mounted power system in accordance with an embodiment.

Turning to FIG. 2A, a first diagram illustrating a rack system (e.g., 200) in accordance with an embodiment is shown. The viewpoint of FIG. 2A may be of a rear side of rack system 200, the viewpoint being from directly behind the rack system and facing a same direction as a front side on the rack system.

This rack system may allow for compact and organized storage (e.g., placement) of any number of chassis (e.g., data processing systems), thereby allowing utilization of various systems to provide the computer implemented services.

To provide its functionality, the rack system may include power supply free (PSF) chassis 202 and 204, and rail mounted power system 203 and 205. Each of the two chassis may be positioned on a rack of the rack system. For example, the rack system may further include attachment portions 206 that are lined up along a vertical axis of vertical rails 207, where each attachment portion of attachment portions 206 may be used to fixedly attach a PSF chassis to a respective rack in the rack system.

The rail mounted power systems may each be mounted to a respective single vertical rail of the rack system. For example, rail mounted power system 203 may include power supply unit (PSU) 210 and 211, and rail mounted power system 205 may include PSU 213 and 214. As previously discussed, power supply units (PSU's) may be positioned outside of a chassis, resulting in a PSF chassis (e.g., PSF 202 and/or 204). To facilitate this positioning, rack system 200 may include any number of connections such as PSU connections 216. For example, PSU 210-214 may be operably connected to various connections of PSU connections 216 to be provided power transmissions (e.g., "power supply level power", discussed further below) facilitated by rail mounted power systems 203 and 205. PSU 210-214 may, in turn, provide the power transmissions further along the rail mounted power systems as "logic level power" (discussed further below) to at least a portion of the hardware components and/or additional hardware resources.

To provide their functionalities, PSU connections 216 may be implemented by sockets formed along the rails of rack system 200 that include operable connections for various power transmissions to be facilitated between the rail mounted power systems and any chassis positioned in a rack of rack system 200. In some cases, PSU connections 216 may only restrict movement of a PSU to a limited portion of the exterior by facilitating fixed attachments between each of the PSU and corresponding connections of PSU connections 216. Thus, PSU connections 216 may facilitate various levels (e.g., various degrees) of attachment between each of the PSU and the rail mounted power systems.

Regardless of what level of attachment may be facilitated by PSU connections 216 (so long as the operable connections are facilitated), logic level power lines 218 may direct the power transmissions for the hardware components and/or the additional hardware resources, mentioned previously. For example, logic level power lines 218 may operably connect directly and/or indirectly (e.g., via PSU connections 216) to a PSU of the PSU's. In doing so, logic level power lines 218 may provide a path through which the power transmissions may traverse during operation of either chassis.

To provide their functionality, logic level power lines 218 may be implemented by cabling, connectors, etc. that establish electrical connections used to transmit power to the hardware components and/or the additional hardware resources.

However, the power transmitted via logic level power lines 218 may have an alternating current (AC) (e.g., may be AC power), and therefore may not be natively usable by the hardware components and/or the additional hardware resources. To modify the power transmission so that the hardware components and/or the additional hardware resources may natively use the power, the power transmission may be passed through one or more interposers (e.g., 220).

For example, some of logic level power lines 218 may direct power transmissions from PSU 211 of rail mounted power system 203, through interposer 220, and to the hardware components and/or the additional hardware resources. In doing so, the hardware components and/or the additional hardware resources may natively use the power output from interposer 220, interposer 220 modifying the power transmission to output a direct current (DC) rather than an AC.

To modify the power from an AC to a DC, interposer 220 may route power from the PSU 211 to at least a portion of the hardware components and/or the additional hardware resources (e.g., electronics 102, discussed previously). For example, interposer 220 (e.g., 107 in FIG. 1) may include an electrical interface that receives power at a first connection (e.g., via some power cables and/or connection pins operably connected to at least a portion of logic level power lines 218) and spreads at least a portion of that power to any number of different connections (e.g., that lead to the various hardware components of, for example, electronics 102, and/or the additional hardware resources).

By integrating PSU 211-214 as shown in FIG. 2A, rail mounted power system 203 and 205 may provide power management in a more efficient manner than, for example, rack mounted power supply 222.

For example, to integrate rack mounted power supply 222 with rack system 200, rack mounted power supply 222 may require placement in a position (e.g., in a rack, and/or in at least a portion of collective positions otherwise referred to as "available chassis space") normally usable by various chassis integrated with rack system 200 to provide computer implemented services.

However, by positioning rack mounted power supply 222 in the position, the available chassis space in rack system 200 may be limited similar to the limited available space within chassis 106, discussed with regard to FIG. 1. Consequently, the quantity of chassis capable of being positioned with the rack system may be limited. By limiting the quantity of chassis (and therefore, hardware components therein), a quality, quantity, and/or type of the various functionalities on which the computer implemented services depend may also be limited. Thus, a quality, quantity, and/or type of the computer implemented services may be limited by the limited available chassis space provided by rack system 200.

By using rail mounted power systems, rather than rack mount power supply, Power components may provide power to the interior of PSF chassis (from an exterior of the PSF chassis) without limiting a quality, quantity, and/or type of the computer implemented services.

For additional information regarding management of power transmissions, refer to FIGS. 2B-2C.

Turning to FIG. 2B, a second diagram illustrating the rack system (e.g., 200) in accordance with an embodiment is shown. The viewpoint of FIG. 2B may be from a right side of the rack system, the rear side facing a left of the page and the front side facing a right of the page.

As discussed above, components of rail mounted power system 203 and/or 205 (e.g., PSUs 210-214, logic level power lines 218, interposer 220 (and/or 223), integrated power distribution unit (PDU) 232, high voltage line 330, and/or other components) may be used to manage power provided for the PSF chassis. For example, these components, at least in part, may modify at least a portion of the power transmission provided to either PSF chassis (e.g., 202 and/or 204) for powering the hardware components and/or the additional hardware resources. Thus, operation of the PSF chassis may be enabled.

For example, assume a power providing service directs a power transmission towards a location at a client's request. This power transmission may be transmitted a distance away from the power providing service via powerlines (e.g., high voltage line 230), and thus, may be provided with an alternating current (AC) for efficient transit to the requested location. When this power transmission reaches the requested location, rail mounted power system 205, for example, may obtain the AC (referred to as "rack system level power" at this point of the power transmission) via high voltage line 230.

To do so, the AC may be directed through high voltage power line 230 towards PDU 232 of rail mounted power system 205. PDU 232 may (i) obtain the AC, and (ii) distribute the power transmission to a number of power supply units integrated with rail mounted power system 205 (e.g., 213-214). In doing so, PDU 232 may modify the rack system level power to provide "power supply level power", mentioned previously with regard to FIG. 2A.

As rail mounted power system 205 continues to facilitate the power transmission, the logic level power may be provided to interposer 220 where the AC of the power transmission is modified to provide a DC to the hardware components and/or the additional hardware resources (the DC of the power transmission thereby enabling the native usability of the power transmission by the hardware components and/or the additional hardware resources.

To further manage power provided for the PSF chassis, the rail mounted power systems may further include sensors (e.g., 234 an/or 236, previously mentioned with regard to FIG. 1). These sensors may be used, at least in part, for safety processes regarding power transmissions. For example, the sensors may be used as part of a method for decreasing a likelihood of compromise of the hardware components and/or the additional hardware resources caused by an interruption of power transmissions.

For example, assume the client of the power providing service is at the requested location to provide regularly scheduled maintenance for rack system 200. To service PSF chassis 202 (the top PSF chassis), the client may slide PSF chassis 202 along sliders 208 (to the right of the page) in order to pull PSF chassis 203 out of rack system 200 from the front side of rack system 200. However, rail mounted power systems 203 and 205 may still be operably connected to PSF chassis 202 by logic level power lines 218.

Consequently, as PSF chassis 202 is pulled an unacceptable distance (e.g., a distance that is longer than the maximum distance in which logic level power lines 218 may extend safely and without disconnecting) out through the front side, the logic level power lines 218 may break and/or otherwise disconnect, thereby interrupting any power transmissions being directed to PSF chassis 202.

Such interruption of power allows for compromise of data processing systems of the rack system. For example, the compromise may include data loss or corruption and/or an electrical shortage, leading to a power spike, thereby causing damage to the PSUs, the hardware components, the additional hardware resources, and/or other components.

To decrease a likelihood of the compromise caused by an interruption of power transmissions, the sensors (e.g., 234 and/or 236) may be used to identify whether the power supply free chassis is positioned in an acceptable position. For example, the power components may be adapted to limit distribution of power while the power supply free chassis is not in the acceptable position. For example, the acceptable position may be any position that is a distance shorter than the maximum distance, mentioned previously.

For additional information regarding the sensors, refer to FIG. 2C, below.

Turning to FIG. 2C, a third diagram illustrating the rack system (e.g., 200) in accordance with an embodiment is shown. The viewpoint of FIG. 2C may be the same viewpoint as shown in FIG. 2B.

As noted previously, the rail mounted power system may be mounted on any single vertical rail of the rack enclosure. For example, the rail mounted power system may be integrated with rack system 200 in various ways as shown in FIGS. 2B and/or 2A.

For example, while mounted on vertical rails 207 in FIG. 2B (rails on a rear side of rack system 100), rail mounted power systems 203 and 205 may also be mounted on vertical rails that are on a front side of rack system 200 (e.g., 238).

Thus, a rack system may include the components discussed in FIGS. 2A-2C, a rail mounted power system being mounted to a single vertical rail of the rack system, and the rack system may use the mounted rail mounted power system to manage power for a power supply free chassis of a data processing system.

Figure 3A:
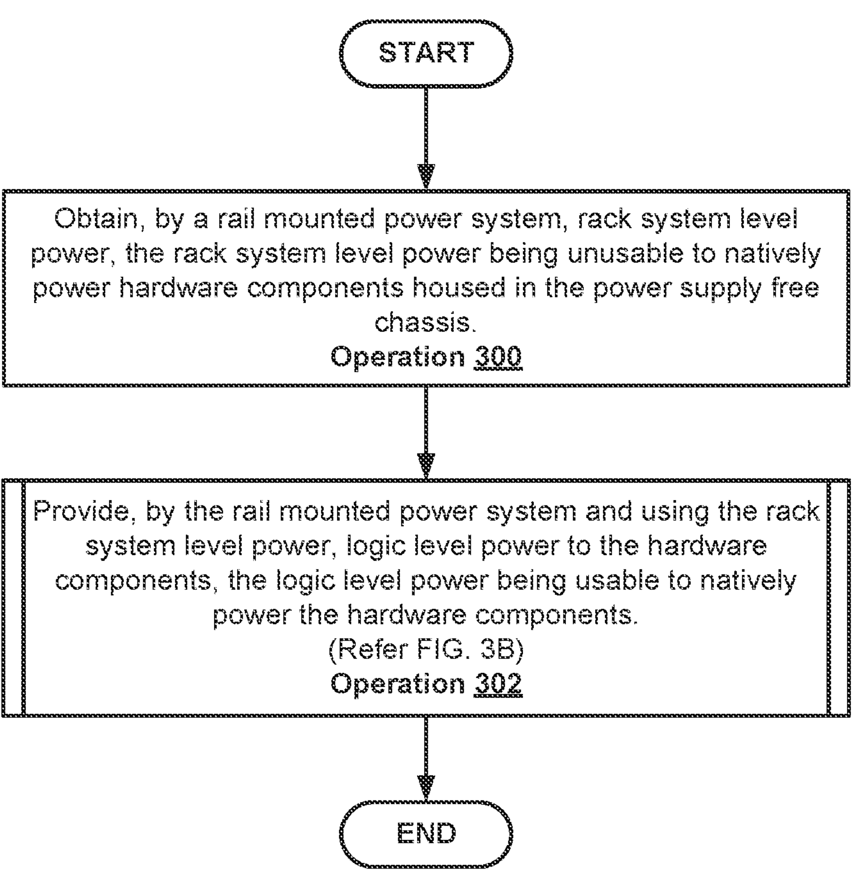
FIG. 3A-3B show flow diagrams illustrating a method for powering hardware components positioned in a power supply free chassis of a rack system in accordance with an embodiment.
Figure 3B:
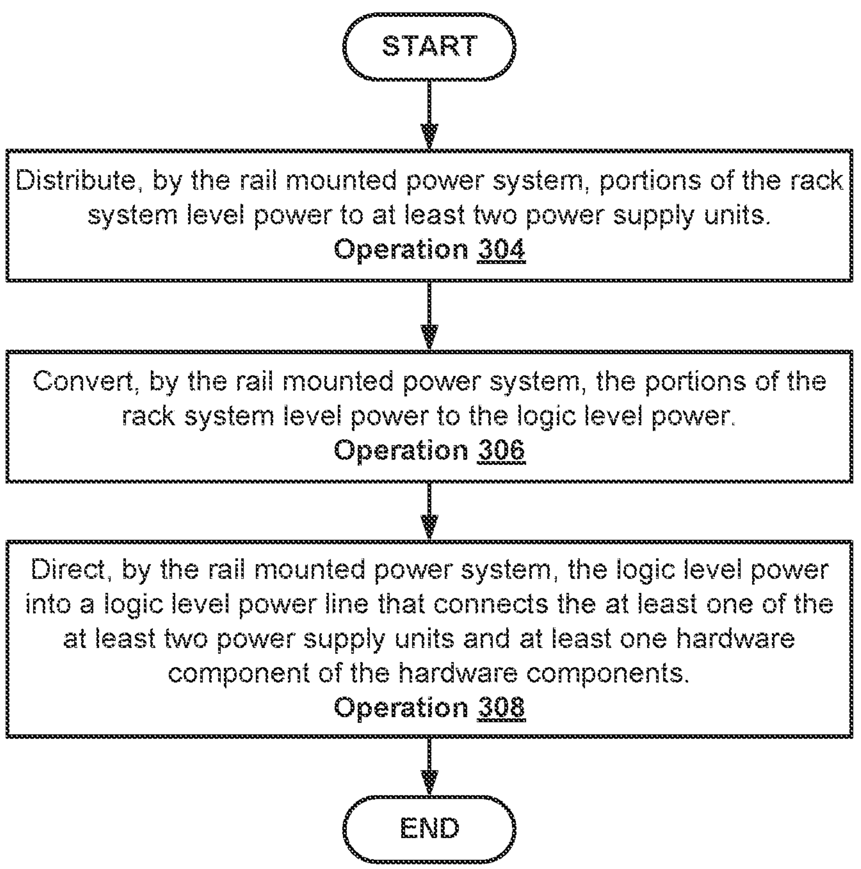
Figure 3C:
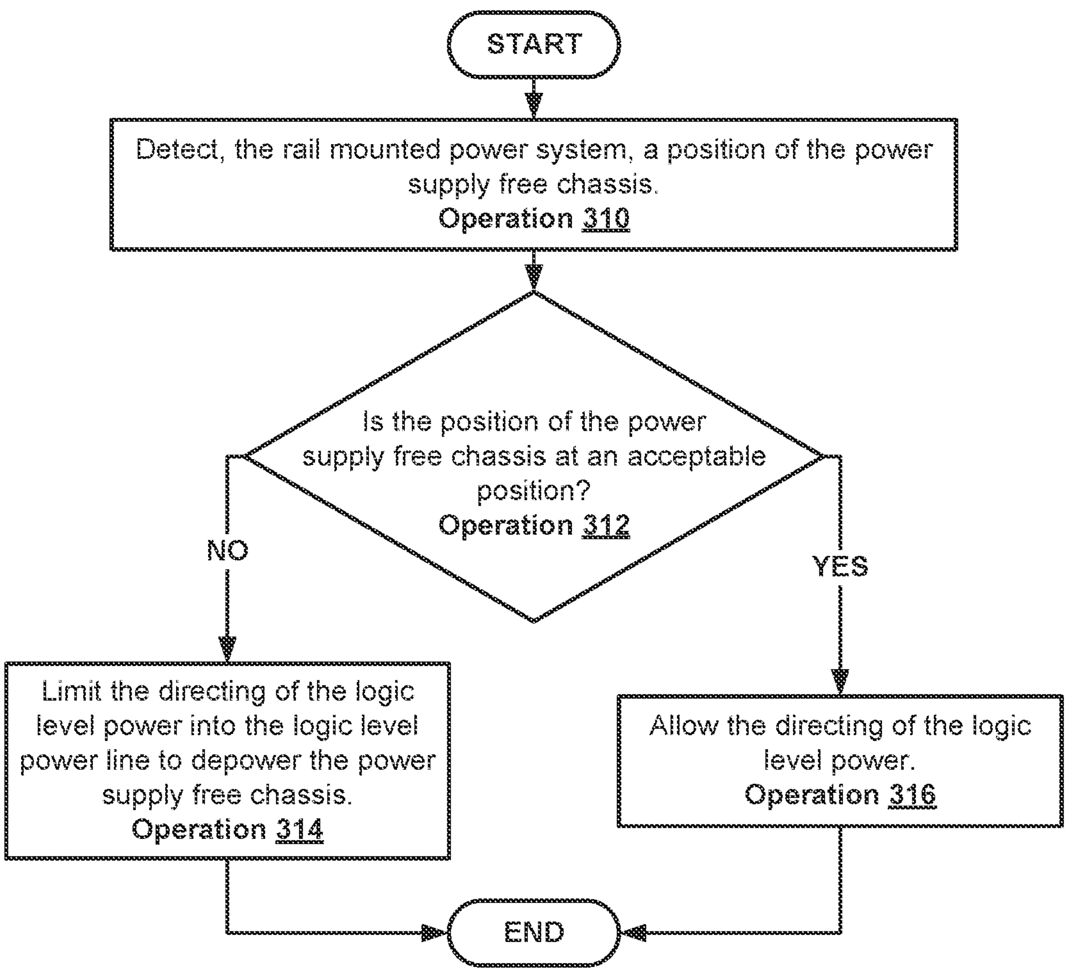
FIG. 3C shows a flow diagram illustrating a method for power management of a power supply free chassis of a rack system in accordance with an embodiment.

As discussed above, the components of FIGS. 1-2C may perform various methods to manage (e.g., power) data processing systems. FIGS. 3A-3C illustrate methods that may be performed by the components of FIGS. 1-2C. In the diagrams discussed below and shown in FIGS. 3A-3C, any operations may be repeated, performed in different orders, and/or performed in parallel with or partially overlapping in time with other operations.

Turning to FIG. 3A, a flow diagram illustrating a method for powering hardware components positioned in (e.g., housed by) a power supply free chassis of a rack system in accordance with an embodiment is shown. The method may be performed by, for example, a rail mounted power system integrated with a single vertical rail of the rack system, and/or any other entity.

It will be appreciated that although described with regard to being integrated with a single vertical rail of the rack system, the rail mounted power system may be capable of integrating with any single vertical rail of the rack system.

At operation 300, rack system level power is obtained by a rail mounted power system, the rack system level power being unusable to natively power hardware components housed in a power supply free chassis. The rack system level power may be obtained via electrical transmission through a high voltage line (e.g., a transmission line). This high voltage line may span a distance between, for example, a source of the electrical transmission (e.g., an electrical service provider's location) and an intended receiver of the electrical transmission (e.g., an onsite location of the rack system).

For example, a first high voltage line may span a distance as described above, and the onsite location of the rack system may include various power outlets through which at least a portion of the rack system level power may be directed. Therefore, a second high voltage line may span a second distance between one of the power outlets and operable connection to the rail mounted power system positioned with a vertical singular rail of the rack system.

Thus, by spanning the distance between the operable connection and a source of the electrical transmission, a high voltage line may direct the rack system level power to a power distribution unit (PDU) of the rail mounted power system, discussed further below.

Additionally, based on a variable distance (e.g., a distance that may vary greatly, depending on specific situations) traversed by the electrical transmission, energy requirements by the hardware components, and/or other implications caused by power management of the hardware components housed in the power supply free chassis, the rack system level power may be provided to the PDU as an alternating current (AC) power source.

However, as mentioned briefly above, this AC power source may not be natively usable by the hardware components. Therefore, to allow for the hardware components to natively use a provided power source, the AC power source (e.g., the rack system level power) may undergo modification to obtain a direct current (DC) power source.

For example, this DC power source may be logic level power, discussed below.

At operation 302 and using the rack system level power, logic level power is provided to the hardware components by the rail mounted power system, the logic level power being usable to natively power the hardware components (and therefore, as discussed above, may be provided to the hardware components as a DC power source).

The rack system level power may be used to provide the logic level power by, for example; (i) distributing portions of the rack system level power to at least two power supply units, (ii) converting these portions of the rack system level power to obtain the logic level power (and thus, converting/modifying an AC to obtain a DC), and once obtained, (iii) directing the logic level power into a logic level power line that connects at least one of the at least two power supply units and at least one hardware component of the hardware components. Thus, when the electrical transmission of this DC of the logic level power is directed at the hardware components, the logic level power may natively power the hardware components.

For additional information regarding the logic level power and how it may be provided, refer FIG. 3B below.

The method may end following operation 302.

As noted above, logic level power may be provided to hardware components using (and/or may be based on) rack system level power. By providing the logic level power, the hardware components may obtain sufficient power to operate, thereby facilitating functionalities that provide computer-implemented services. In FIG. 3B, additional information regarding how the logic level power may be provided is shown.

Turning to FIG. 3B, a flow diagram illustrating a method for providing logic level power in accordance with an embodiment is shown. The method may be performed by, for example, the rail mounted power system integrated with the rack system, and/or any other entity.

At operation 304, portions of the rack system level power are distributed by the rail mounted power system to at least two power supply units. The portions may be distributed by using the PDU of the rail mounted power system, the PDU having multiple outputs adapted to provide electrical protection while regulating power distribution among a number of devices. For example, the PDU may be a switched and/or metered PDU, the PDU determining levels of power usage by and/or available capacity (for additional workloads) of the at least two power supply units.

Performance of this distribution by using the PDU may result in power supply level power being provided by the PDU. For example, by dividing the rack system level power into two portions (intended for two power supply units), these two portions may each be referred to as power supply level power for one of the two power supply units.

Additionally, for example, the power supply level power may be described as a type of power that (i) may or may not have been modified, however, (ii) must be usable by the at least two power supply units.

At operation 306, the portions of the rack system level power are converted to the logic level power by the rail mounted power system. These portions may be converted by using the at least two power supply units of the rail mounted power system, (i) the portions being input for the at least two power supply units, and (ii) the logic level power being output based on the input for the at least two power supply units.

For example, once the portions of the rack system level power (e.g., power supply level power usable by power supplies) are obtained by the at least two power supply units, the at least two power supply units may perform the conversion as part of their functionality, thereby providing the logic level power automatically with regard to the input.

At operation 308, the logic level power is directed, by the rail mounted power system, into logic level power lines that connect the at least one of the at least two power supply units and at least one hardware component of the hardware components. The logic level power may be directed by using, at least in part, a combination of components that may include the at least two power supply units, the logic level power lines, an interposer (may include one or more interposers), and electronics (e.g., the hardware components) housed within the power supply free chassis. At least a portion of these components from this combination may be connected to one another, thereby facilitating various additional electrical transmissions through which the hardware components may receive power to operate.

For example, the at least two power supply units may be adapted to release a generated output (e.g., the output logic level power) from any combination of output connections that may be available. For example, whether an output connection of a power supply unit is available may be based on (i) an architecture of the power supply unit and (ii) whether points of operable connection simultaneously facilitate the release of the generated output as well as operable connection to a power consuming device.

However, the quantity and/or quality of the output may also depend on the architecture (e.g., circuitry) of the at least two power supply units, and/or may depend on the power demand from any of the electronics (e.g., power required for any of the electronics to operate).

Therefore, if a logic level power line is operably connected to the output connection throughout a duration of a release of generated output, then the logic level power line may facilitate a second portion of the electrical transmission (e.g., a first portion being the conductive structures of the operably connected output connection). For example, the logic level power line may facilitate the second portion of the electrical transmission in a similar manner to the high voltage power line that provided the rack system level power on which the logic level power depends.

Thus, this logic level power line may allow for the electrical transmission to traverse to a third component through which a third portion of the electrical transmission may be facilitated. This third portion may be facilitated using an interposer that routes received electrical transmissions from, for example, the logic level power line and spreads (e.g., divides) power from the electrical transmission across various conductive paths (e.g., cables, wires, and/or other circuitry, etc.) that (i) lead through the interior of the power supply free chassis, and at an end of each respective conductive path (ii) operably connect to a hardware component, thereby powering the hardware components to operate.

Thus, a DC power source such as the logic level power may be natively usable by the hardware components regardless of whether power supplies are positioned externally from a chassis or within an interior of the chassis.

The method may end following operation 308.

As discussed above, a rail mounted power system may provide power to hardware components of a data processing system. In addition to providing power, other power management functionalities may be provided by the rail mounted power system. For example, power related safety procedures may be provided that may decrease a likelihood of damage to the rack system (and thus, damage to the hardware components housed by the power supply free chassis) caused by ill-advised processes. For example, while electrical transmissions are traversing across the rack system, an ill-advised process may include detaching any two components (e.g., of the combination discussed with regard to FIG. 2B) from one another while the hardware components perform processing of workloads. Such ill-advised processes may have catastrophic outcomes for both the integrity of the workloads and/or the hardware components.

Turning to FIG. 3C, a flow diagram illustrating a method for power management in accordance with an embodiment is shown. The method may be performed by, for example, the rail mounted power system integrated with the rack system, and/or any other entity.

At operation 310, a position of the power supply free chassis is detected by the rail mounted power system. The position may be detected by using a sensor aligned with a rack (e.g., the sliders shown in FIGS. 2A-2C) of the rack system on which the power supply free chassis may be positioned. The sensor may be positioned along this alignment a first distance away from the back of the rack, as shown in FIG. 3B. Furthermore, the first distance may be a same distance as a second distance, the logic level power lines (e.g., as shown in FIGS. 2A-2C) being able to extend by the second distance without interrupting power transmissions and/or otherwise disconnecting operable connections.

However, for example, if the logic level power lines are extended further than the second distance, the power transmissions may be interrupted and/or the operable connections that allow power transmissions via the logic level power lines may otherwise be disconnected.

For example, by positioning the sensor away from the back of the rack by the first distance (e.g., as shown in FIG. 2B), the sensor may only detect the power supply free chassis if the power supply free chassis is almost entirely pushed into the rack of the rack system (e.g., at least 90% of the power supply free chassis enclosed by the rack system).

For example, if the power supply free chassis is pulled out through the front of the rack (with all connections intact) by a distance less than the first distance, the logic level power lines may not disconnect, and the sensor may detect the position of the power supply free chassis. Once the first distance is reached, the sensor may no longer detect the power supply free chassis and the logic level power lines may be taught but may not disconnect. Once the first distance is exceeded, the sensor may continue to not detect the power supply free chassis and the logic level power lines may be disconnected. Consequently, if pulled further than the first distance, the connections may be terminated, thereby causing catastrophic outcomes for the rack system and/or any components housed therein.

Thus, any position within the first distance may be regarded as an acceptable position (discussed below), the acceptable position indicating, for example, a risk of and/or a likelihood of the catastrophic outcomes caused by interruption of the power transmissions.

At operation 312, a determination is made regarding whether the position of the power supply free chassis is at an acceptable position. To do so, the position of the power supply free chassis is compared to the acceptable position by the rail mounted power system. The position may be compared to the acceptable position by, based on the above example, checking whether the position was or wasn't detected by the sensor. If detected by the sensor, the position may be one of several acceptable positions that do not place the logic level power lines at risk of disconnecting. Additionally, if not detected by the sensor, the position may be, for example, either a risky position at which further extension of the logic level power lines may lead to catastrophic outcomes, or that the power transmissions have already been interrupted and catastrophic outcomes are likely to follow (e.g., likely to occur).

It will be appreciated that the position and/or the acceptable position are not to be limited by embodiments herein. Therefore, the position and/or the acceptable position may not be based on the first and/or second distance and may instead be defined based on other metrics to prevent interruptions of the power transmissions.

If determined that the position of the power supply free chassis is not at one of the several acceptable positions, then the method may proceed to operation 314. Otherwise, the method may proceed to operation 316.

At operation 314, the directing of the logic level power into the logic level power line is limited by the rail mounted power system to depower (e.g., and/or otherwise manage power for) the power supply free chassis. The directing of the logic level power may be limited by (i) preparing hardware components for a loss in power, and for example, once one of the hardware components is prepared, (ii) safely interrupting one or more power transmissions intended for the hardware component.

To prepare the hardware component for the loss in power, task ending processes may be performed. The task ending processed may include limiting and/or preventing entirely a flow of power through the logic level power lines to safely interrupt the one or more power transmissions.

The method may end following operation 314.

Returning to operation 312, the method may proceed to operation 316.

At operation 316, the directing of the logic level power is allowed by the rail mounted power system. The directing of the logic level power may be allowed by continuing to direct the logic level power until, for example, (i) the power supply free chassis is placed in a position that is not an acceptable position, (ii) the power transmissions are interrupted, (iii) a request to limit the directing is obtained, and/or (iv) the rack system (and/or power supply free chassis housed within) otherwise indicates a need for limiting the directing.

The method may end following operation 316.

Thus, using the methods illustrated in FIGS. 3A-3C, embodiments disclosed herein may provide power management (e.g., providing power and/or limiting power) for hardware components (e.g., of data processing systems) using a rail mounted power system. In doing so, power usable by the hardware components may be directed to the hardware components from an exterior of chassis housing respective hardware components.

Therefore, each (or any number) of the chassis may be implemented using a power supply free chassis. Consequently, additional space within the power supply free chassis may be provided to increase a quality and/or a quantity of hardware components positioned within (e.g., installed into) the power supply free chassis. Thus, by increasing the quality, type, and/or the quantity of hardware components positioned within (e.g., installed into) the power supply free chassis, a likelihood of increasing a quality, type, and/or quantity of the computer implemented services provided may also be increased.

Figure 4:
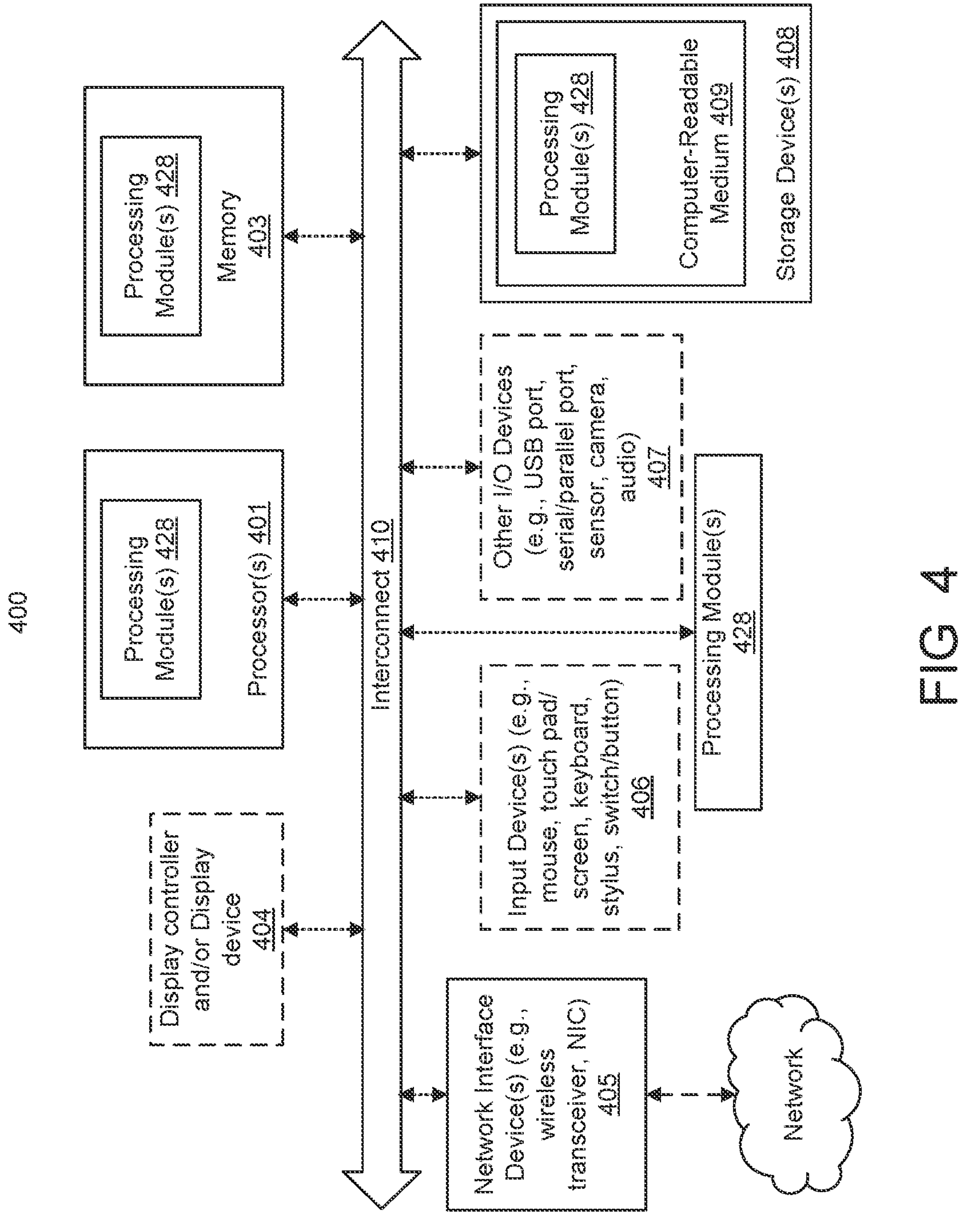
FIG. 4 shows a block diagram illustrating a data processing system in accordance with an embodiment.

Any of the components illustrated in and/or discussed with regard to FIGS. 1-3C may be implemented with and/or used in conjunction with one or more computing devices. For example, the security bezel may be used to secure a chassis in which components of a data processing system may be positioned (e.g., processors, memory, etc.). Turning to FIG. 4, a block diagram illustrating an example of a data processing system (e.g., a computing device) in accordance with an embodiment is shown. For example, system 400 may represent any of data processing systems described above performing any of the processes or methods described above. System 400 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 400 is intended to show a high-level view of many components of the computer system. However, it is to be understood that additional components may be present in certain implementations and furthermore, different arrangement of the components shown may occur in other implementations. System 400 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 400 includes processor 401, memory 403, and devices 405-407 via a bus or an interconnect 410. Processor 401 may represent a single processor or multiple processors with a single processor core or multiple processor cores included therein. Processor 401 may represent one or more general-purpose processors such as a microprocessor, a central processing unit (CPU), or the like. More particularly, processor 401 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 401 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 401, which may be a low power multi-core processor socket such as an ultra-low voltage processor, may act as a main processing unit and central hub for communication with the various components of the system. Such processor can be implemented as a system on chip (SoC). Processor 401 is configured to execute instructions for performing the operations discussed herein. System 400 may further include a graphics interface that communicates with optional graphics subsystem 404, which may include a display controller, a graphics processor, and/or a display device.

Processor 401 may communicate with memory 403, which in one embodiment can be implemented via multiple memory devices to provide for a given amount of system memory. Memory 403 may include one or more volatile storage (or memory) devices such as random-access memory (RAM), dynamic RAM (DRAM), synchronous DRAM (SDRAM), static RAM (SRAM), or other types of storage devices. Memory 403 may store information including sequences of instructions that are executed by processor 401, or any other device. For example, executable code and/or data of a variety of operating systems, device drivers, firmware (e.g., input output basic system or BIOS), and/or applications can be loaded in memory 403 and executed by processor 401. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

System 400 may further include IO devices such as devices (e.g., 405, 406, 407, 408) including network interface device(s) 405, optional input device(s) 406, and other optional IO device(s) 407. Network interface device(s) 405 may include a wireless transceiver and/or a network interface card (NIC). The wireless transceiver may be a Wi-Fi transceiver, an infrared transceiver, a Bluetooth transceiver, a WiMAX transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 406 may include a mouse, a touch pad, a touch sensitive screen (which may be integrated with a display device of optional graphics subsystem 404), a pointer device such as a stylus, and/or a keyboard (e.g., physical keyboard or a virtual keyboard displayed as part of a touch sensitive screen). For example, input device(s) 406 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 407 may include an audio device. An audio device may include a speaker and/or a microphone to facilitate voice-enabled functions, such as voice recognition, voice replication, digital recording, and/or telephony functions. Other IO devices 407 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. IO device(s) 407 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 410 via a sensor hub (not shown), while other devices such as a keyboard or thermal sensor may be controlled by an embedded controller (not shown), dependent upon the specific configuration or design of system 400.

To provide for persistent storage of information such as data, applications, one or more operating systems and so forth, a mass storage (not shown) may also couple to processor 401. In various embodiments, to enable a thinner and lighter system design and improve system responsiveness, this mass storage may be implemented via a solid-state device (SSD). However, in other embodiments, the mass storage may primarily be implemented using a hard disk drive (HDD) with a smaller amount of SSD storage to act as an SSD cache to enable non-volatile storage of context state and other such information during power down events so that a fast power up can occur on re-initiation of system activities. Also, a flash device may be coupled to processor 401, e.g., via a serial peripheral interface (SPI). This flash device may provide for non-volatile storage of system software, including a basic input/output software (BIOS) as well as other firmware of the system.

Storage device 408 may include computer-readable storage medium 409 (also known as a machine-readable storage medium or a computer-readable medium) on which is stored one or more sets of instructions or software (e.g., processing module, unit, and/or processing module/unit/logic 428) embodying any one or more of the methodologies or functions described herein. Processing module/unit/logic 428 may represent any of the components described above. Processing module/unit/logic 428 may also reside, completely or at least partially, within memory 403 and/or within processor 401 during execution thereof by system 400, memory 403 and processor 401 also constituting machine-accessible storage media. Processing module/unit/logic 428 may further be transmitted or received over a network via network interface device(s) 405.

Computer-readable storage medium 409 may also be used to store some software functionalities described above persistently. While computer-readable storage medium 409 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of embodiments disclosed herein. The term "computer-readable storage medium" shall accordingly be taken to include, but not be limited to, solid-state memories, and optical and magnetic media, or any other non-transitory machine-readable medium.

Processing module/unit/logic 428, components and other features described herein can be implemented as discrete hardware components or integrated in the functionality of hardware components such as ASICS, FPGAs, DSPs or similar devices. In addition, processing module/unit/logic 428 can be implemented as firmware or functional circuitry within hardware devices. Further, processing module/unit/logic 428 can be implemented in any combination hardware devices and software components.

Note that while system 400 is illustrated with various components of a data processing system, it is not intended to represent any particular architecture or manner of interconnecting the components as such details are not germane to embodiments disclosed herein. It will also be appreciated that network computers, handheld computers, mobile phones, servers, and/or other data processing systems which have fewer components, or perhaps more components may also be used with embodiments disclosed herein.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments disclosed herein also relate to an apparatus for performing the operations herein. Such a computer program is stored in a non-transitory computer readable medium. A non-transitory machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g., circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments disclosed herein are not described with reference to any particular programming language. It will be appreciated that a variety of programming languages may be used to implement the teachings of embodiments disclosed herein.

In the foregoing specification, embodiments have been described with reference to specific exemplary embodiments thereof. It will be evident that various modifications may be made thereto without departing from the broader spirit and scope of the embodiments disclosed herein as set forth in the following claims. The specification and drawings are, accordingly, to be regarded in an illustrative sense rather than a restrictive sense.

What is claimed is:

1. A rack system comprising:

a power supply free chassis adapted to house hardware components that provide computer implemented services; and a rail mounted power system adapted for mounting directly to a single vertical rail of an enclosure system, the rail mounted power system comprising:

at least two power supply units adapted to:

obtain power supply level power from a power distribution unit, and provide logic level power to the hardware components using the power supply level power; and the power distribution unit adapted to:

obtain rack system level power, and provide the power supply level power to the at least two power supply units.

2. The rack system of claim 1, wherein providing the logic level power comprises:

converting the power supply level power to the logic level power; and directing the logic level power to a logic level power line that connects at least one of the at least two power supply units to at least one hardware component of the hardware components.

3. The rack system of claim 2, wherein the at least one hardware component is connected to the at least one of the at least two power supply units via an interposer positioned in the power supply free chassis.

4. The rack system of claim 3, further comprising:

the interposer adapted to:

obtain the logic level power;

divide the logic level power into a plurality of portions; and distribute the plurality of portions to the hardware components.

5. The rack system of claim 2, wherein the logic level power is usable to power the hardware components without modification.

6. The rack system of claim 1, further comprising:

a second power supply free chassis adapted to house second hardware components that provide second computer implemented services, wherein the at least two power supply units are further adapted to:

provide logic level power to the second hardware components using the power supply level power.

7. The rack system of claim 6, wherein the power supply free chassis and the second power supply free chassis are vertically stacked in the rack system using the single vertical rail.

8. The rack system of claim 6, wherein the power supply free chassis and the second power supply free chassis are positioned in two separate vertical stacks of power supply free chassis, the power supply free chassis and the second power supply free chassis are separated by the single vertical rail, and the rail mounted power system is positioned between the power supply free chassis and the second power supply free chassis.

9. The rack system of claim 1, further comprising:

a second rail mounted power system adapted for mounting directly to a second single vertical rail of the enclosure system.

10. The rack system of claim 9, wherein the power supply free chassis is adapted to be redundantly powered by the rail mounted power system and the second rail mounted power system.

11. The rack system of claim 9, wherein the single vertical rail and the second single vertical rail are positioned on opposite sides of the power supply free chassis.

12. The rack system of claim 1, wherein the rail mounted power system further comprises:

a sensor adapted to identify whether the power supply free chassis is positioned in a first position.

13. The rack system of claim 12, wherein the at least two power supply units are further adapted to limit distribution of the logic level power while the power supply free chassis if not in the first position.

14. A rail mounted power system adapted for mounting directly to a single vertical rail of an enclosure system, the rail mounted power system comprising:

at least two power supply units adapted to:

obtain power supply level power from a power distribution unit, and provide logic level power to hardware components housed in a power supply free chassis using the power supply level power; and the power distribution unit adapted to:

obtain rack system level power, and provide the power supply level power to the at least two power supply units.

15. The rail mounted power system of claim 14, further comprising:

a second rail mounted power system adapted for mounting directly to a second single vertical rail of the enclosure system.

16. The rail mounted power system of claim 15, wherein the power supply free chassis is adapted to be redundantly powered by the rail mounted power system and the second rail mounted power system.

17. The rail mounted power system of claim 16, wherein the single vertical rail and the second single vertical rail are positioned on opposite sides of the power supply free chassis.

18. A method for powering hardware components positioned in a power supply free chassis of a rack system, the method comprising:

obtaining, by a rail mounted power system of the rack system that is positioned outside of the power supply free chassis and on a single vertical rail of the rack system, rack system level power, the rack system level power being unusable to natively power the hardware components; and providing, by the rail mounted power system of the rack system and using the rack system level power, logic level power to the hardware components, the logic level power being usable to natively power the hardware components.

19. The method of claim 18, wherein providing the logic level power comprises:

distributing, by a power distribution unit of the rail mounted power system, portions of the rack system level power to at least two power supply units;

converting, by the at least two power supply units, the portions of the rack system level power to the logic level power; and directing, by at least one of the at least two power supply units, the logical level power into a logic level power line that connects the at least one of the at least two power supply units and at least one hardware component of the hardware components.

20. The method of claim 19, further comprising:

detecting, by a sensor of the rail mounted power system, a position of the power supply free chassis;

comparing, by the rail mounted power system, the position of the power supply free chassis to an acceptable position; and in an instance of the comparing where the position of the power supply free chassis is not in the acceptable position:

limiting, by the rail mounted power system, the directing of the logical level power into the logic level power line to depower the power supply free chassis.

* * * * *